(12) United States Patent
Tung

(10) Patent No.: US 6,232,240 B1
(45) Date of Patent: *May 15, 2001

(54) METHOD FOR FABRICATING A CAPACITOR

(75) Inventor: Chia-Ching Tung, Kaohsiung (TW)

(73) Assignee: Vanguard International Semiconductor Corporation, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/239,883

(22) Filed: Jan. 29, 1999

(51) Int. Cl.[7] .................................................. H01L 21/302
(52) U.S. Cl. ........................ 438/745; 438/749; 438/750; 438/753; 438/754; 438/756
(58) Field of Search .................................. 438/253, 254, 438/239, 255, 745, 753, 754, 756, 749, 750

(56) References Cited

U.S. PATENT DOCUMENTS

| | | | |
|---|---|---|---|
| 5,622,889 | * 4/1997 | Yoo et al. ............................ | 438/397 |
| 5,721,168 | * 2/1998 | Wu ...................................... | 438/253 |
| 5,733,808 | * 3/1998 | Tseng .................................. | 438/239 |
| 5,759,888 | * 6/1998 | Wang et al. ........................ | 438/239 |
| 5,843,822 | * 12/1998 | Hsia et al. .......................... | 438/254 |
| 5,851,875 | * 12/1998 | Ping ................................... | 438/253 |
| 5,940,701 | * 8/1999 | Tseng .................................. | 438/253 |
| 5,989,952 | * 11/1999 | Jen et al. ............................ | 438/253 |

* cited by examiner

Primary Examiner—Robert Kunemund
Assistant Examiner—Binh X. Tran
(74) Attorney, Agent, or Firm—Christensen O'Connor Johnson Kindness PLLC

(57) ABSTRACT

A method for forming a capacitor on a substrate is disclosed herein. The method according to the present invention can increase the capacitance of a capacitor in one interface-etching process, the method mention above includes the following step. The first step is to form a storage node in a dielectric layer on the substrate, wherein the bottom of a cubic portion of the storage node faces the substrate is buried in the dielectric layer, and the storage node is coupled to the substrate. Next, interface-etching the dielectric layer to expose the surface including the bottom of the cubic portion of the storage node. In etching the dielectric layer made of BPSG, the buffer oxide etching (B.O.E) is utilized. Then an insulating layer is formed on the exposed surface including the bottom of the cubic portion of the storage node. Finally, a conductive layer is formed on the insulating layer. The storage node, the insulating layer, and the conductive layer constitute the capacitor.

16 Claims, 4 Drawing Sheets

METHOD FOR FABRICATING A CAPACITOR

BACKGROUND OF THE INVENTION

1. Field of the Invention

This invention relates to a method for fabricating a capacitor, and more particularly, relates to a method for fabricating a DRAM cell and simultaneously increasing capacitance of the capacitor as well as reducing step height between the periphery circuit region and the memory cell region of the DRAM cell.

2. Description of the Prior Art

For high density DRAMs, such as in the 1 GB DRAM and larger, the density of the memory cells is increased when compared with the low capacity DRAMs. A DRAM cell contains a memory cell array region and a periphery region. The memory cells are formed within the memory cell array region, and the periphery circuit is fabricated in the periphery region. The memory cell in the memory cell array region is basically composed of a transistor and a capacitor, which includes a storage node as a cubic electrode of the capacitor. Due to the high intensity of memory cell, and the structure of the storage node, the step height between the memory cell array region and the periphery region introduces a serious problem, such as exposure, alignment, and focus, in following processes that fabricating the DRAM.

In order to increase the charges stored in a capacitor, a stacked capacitor is developed, but there is a difference between the altitude of the stacked capacitor in a memory cell region and the altitude of the periphery region. As shown in FIG. 1, the cross-sectional view of a wafer shows that a memory cell region 10 and a periphery region 11 are on a substrate 12. A first bit line 14 and a gate electrode 15 of a transistor are formed on the substrate 12, in addition, a first dielectric layer 16 is formed on and between the first bit line 14 and the gate electrode 15. Then a second bit line 20 and a third bit line 21 are formed on the cubic dielectric layer 16, besides, a second dielectric layer 23 is formed on the second bit line 20 and the third bit line 21. A third dielectric layer 24 is formed on topography of the wafer including the memory cell region 10 and the periphery region 11, in addition, the second dielectric layer 23 between the second bit line 20 and the third dielectric layer 24 acts as an diffusion barrier layer. During fabricating a storage node 25 of the capacitor in the memory cell region 10, the third dielectric layer 24 is etched and a first dielectric material is formed on the etched on the third dielectric layer 24. The storage node 25 made of the first conductive material is a first electrode of the capacitor.

To fabricate an insulating film of the capacitor, the third dielectric layer 24 is partially removed to expose a cubic portion of the storage node. Refer to FIG. 2, the fourth dielectric layer 30 is formed on the exposed storage node 25 and on the etched third dielectric layer 24, subsequently, a conductive layer 31 is formed on the fourth dielectric layer 30. Then the fourth dielectric layer 30 and the conductive layer 31 are patterned to fit the necessary size. The patterned fourth dielectric layer 30 and the conductive layer 31 act as the insulating layer and the second conductive plate of the capacitor respectively. Thus the transistor is fabricated in the memory cell region 10. To isolate the electricity of the capacitor composed of the fourth dielectric layer 30, the conductive layer 31 and the underlying storage node 25, a fifth dielectric layer 35 is formed on the topography of the wafer including the memory cell region 10 and the periphery region 11.

After the capacitor is fabricated, proceed with the periphery region 11 to manufacture the periphery circuit in the periphery region 11. So the periphery circuit mentioned above, the bit lines and the gate electrode 15 of the transistor are formed as shown in FIG. 3. In addition, the periphery circuit mentioned above, the bit lines and the gate electrode 15 of the transistor are used to control the charge stored in the stacked capacitor. Due to the exposed portion of the stacked capacitor, as shown in FIG. 3, the altitude of the fifth dielectric layer 35 in the memory cell region 10 is higher than the altitude of the fifth dielectric layer 35 in the periphery region 11. The altitude difference α between the memory cell region 10 and the periphery region 11 of the prior art DRAM shown in FIG. 3 is the step height between the memory cell region 10 and the periphery region 11. Due to the step height α, it is difficult to proceed with the periphery region 11 to form the periphery circuit in the periphery region 11 because of the problems such as focus problem raised from the step height α.

SUMMARY OF THE INVENTION

Because the step height between the memory cell region and the periphery region in the prior art memory device is too large, many problems are raised from the large step height. In addition, the improvement of the effective surface area of the storage node in the prior art capacitor is necessary in fabricating a memory device in the trend of increasing density of integrated circuit.

One of the purposes of the present invention is to increase the effective area of the capacitor (the surface area of the storage node adjacent to the dielectric layer); thus the capacitance of the capacitor is increased. In addition, the other purpose of the present invention is to reduce the step height between the memory cell region and the periphery region of the memory device. So the problem raised from the step height is averted in the present invention.

A method for forming a memory device is disclosed herein, the method according to the preferred embodiment of the present invention includes the following steps. First, a bit line and a transistor are formed on a first region of a substrate. A portion of the first region of the substrate is between the bit line and the transistor. Then a transistor is formed on the first dielectric layer on the bit line, the transistor, and the exposed portion of the first region of the substrate. Subsequently, a second dielectric layer is formed on the first dielectric layer and a second portion of the substrate. Then a interface-etching step is used to etch the second dielectric layer to expose the portion of the first region of the substrate.

The next step is to form a storage node that contacting with the portion of the first region of the substrate within the second dielectric layer. The storage node includes a cubic portion connecting to the exposed portion of the first region of the substrate. The bottom of the cubic portion of the storage node faces the substrate. Then the second dielectric layer is etched to expose the surface including the bottom of the cubic portion of the storage node. In the step mentioned above, the effective area of the capacitor is increased. The next step is to form an insulating layer on the exposed surface including the bottom of the cubic portion of the storage node. Then form a conductive layer on the insulating layer, wherein the storage node, the insulating layer, and the conductive layer constitutes the capacitor within the first region of the substrate, besides, the capacitor is electrically coupled to the transistor.

Subsequently, form the periphery circuit within the second region of the substrate, the forgoing periphery circuit is used to control charges stored in the capacitor. Finally, form a third dielectric layer on the periphery circuit within the second region of the substrate, on the second dielectric layer within the second region of the substrate, and on the transistor within the first portion of the substrate. The altitude of the third dielectric layer within the second region of the substrate is higher than that of the bottom of the cubic portion of the storage node facing the substrate. The altitude of the third dielectric layer within the second region of the substrate is lower than the altitude of the third dielectric layer within the first region of the substrate. Thus the step height between the memory cell region and the periphery region is reduced according to the present invention.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Figure 4:
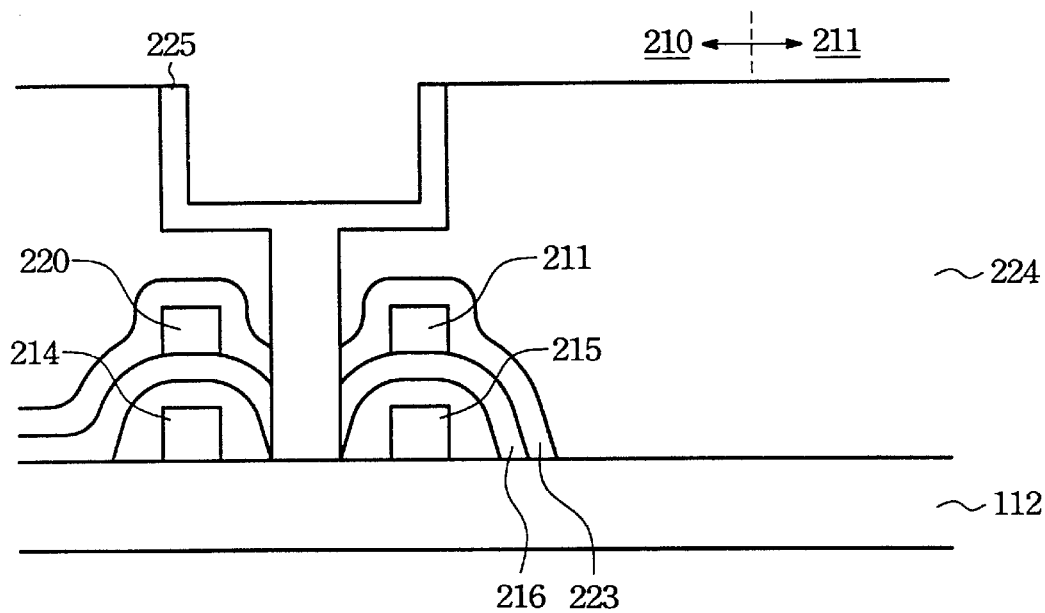
FIG. 4 is the cross sectional view of the wafer that a storage node is formed in a dielectric layer according to the present invention, in which the bit line and the transistor are formed in the dielectric layer.
Figure 5:
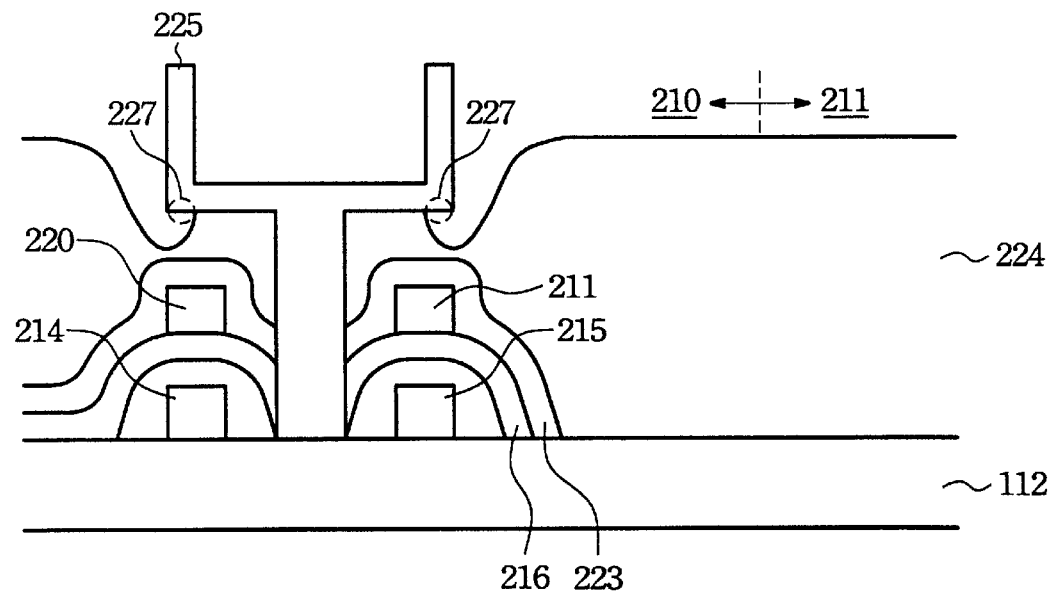
FIG. 5 shows that an interface etching step according to the present invention is used to etch the dielectric layer at the interface of the dielectric layer and the storage node.

The present invention provides a method for fabricating a memory device (such as a DRAM) by reducing step height between the periphery circuit region and the memory cell region of the memory device. In manufacturing a DRAM cell, as shown in FIG. 4, a substrate 112 is provided. The cross-sectional view of a wafer shows that the substrate 112 includes a memory cell region 210 and a periphery region 211. A first bit line 214 and a gate electrode 215 of a transistor are formed on the substrate 112. In addition, a first dielectric layer 216 is formed on and between the first bit line 214 and the gate electrode 215.

Then a second bit line 220 and a third bit line 221 are formed on the first dielectric layer 216, besides, a second dielectric layer 223 is formed on the second bit line 220 and the third bit line 221. The first bit line 214 can be made of conductive material such as poly silicon, and the first dielectric layer 216 can be made of silicon nitride in the preferred embodiment of the present invention. A second dielectric layer 223 is formed on the second bit line 220, the third bit line 221, and the first dielectric layer 216. Then a third dielectric layer 224 is formed on topography of the wafer including the memory cell region 210 and the periphery region 211, in addition, the second dielectric layer 223 between the second bit line 220 and the third dielectric layer 224 acts as a diffusion barrier layer.

During fabricating a storage node 225 of the capacitor in the memory cell region 210, the third dielectric layer 224 is etched and a first dielectric material is formed on the etched on the third dielectric layer 224. The storage node 225 made of the first conductive material is a first electrode of the capacitor. In fabricating the storage node 225, the third dielectric layer 224 is used to shape the profile of the storage node 225. As shown in FIG. 4, the cubic portion of the storage node 225 is connected to the substrate 112, and is as high as the third dielectric layer 224. So the memory cell region 210 is as high as the periphery region 211 when the storage node 225 is formed in the third dielectric layer 224. The bottom of the cubic portion of the storage node 225 facing the substrate 112 is buried in the third dielectric layer 224 after the storage node 225 is fabricated.

After the storage node 225 is formed in the third dielectric layer 224, in order to fabricate an insulating film of the capacitor, the third dielectric layer 224 is partially removed to expose a cubic portion including the bottom of the storage node 225. In the preferred embodiment of the present invention, a recipe is used to partially etch the third dielectric layer 224 and to etch the third dielectric layer 224 at the interface between the third dielectric layer 224 and the storage node 225. The third dielectric layer 224 in the preferred embodiment of the present invention can be formed by atmospheric chemical vapor deposition (APCVD) BPSG (Borophosphosilicate Glass). Due to the material of the third dielectric layer 224 in the preferred embodiment of the present invention, the recipe used to interface etching the third dielectric layer 224 includes buffer oxide etching (B.O.E). In fabricating the third dielectric layer 224, a source gas containing boron atoms about 5–7 weight-percents, and phosphorus atoms about 2–4 weight-percents is used to deposit the third dielectric layer 224. In addition, the storage node 225 in the preferred embodiment of the present invention can be formed of doped poly-silicon.

Because of the interface etching process in the present invention, a portion of a bottom surface 227 of the cubic portion of the storage node 225 facing the substrate 112 is exposed in one etching step. The bottom surface 227 of the cubic portion, which is buried in the dielectric layer in the prior art, of the storage node 225 facing the substrate 112 is exposed by the interface etching step in the present invention. So the area of the first electrode of the capacitor is increased, and the capacitance of the capacitor in the present invention is increased.

Figure 6:
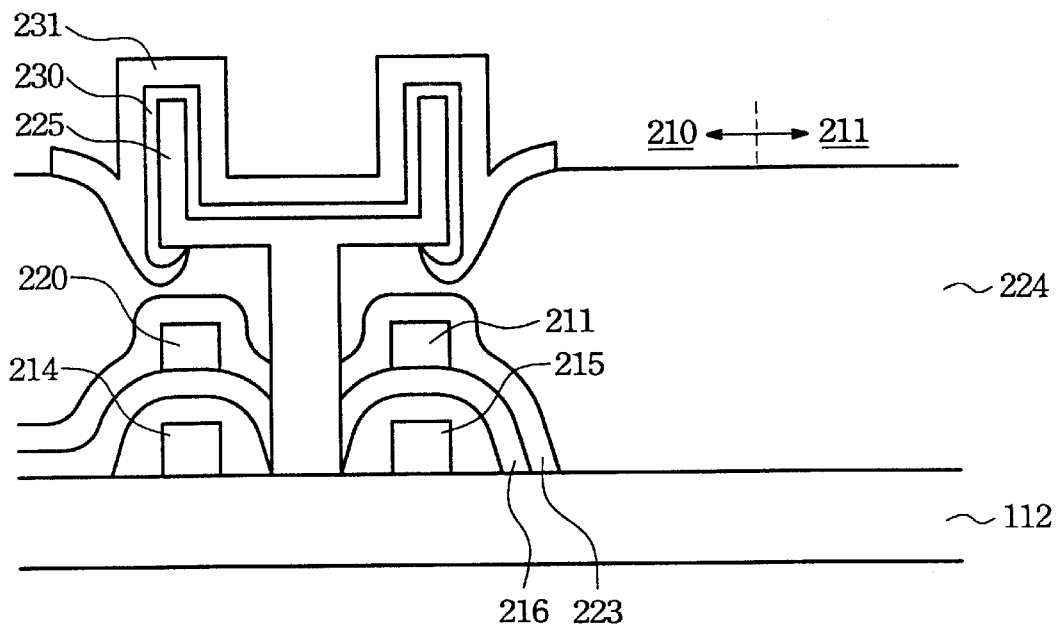
FIG. 6 shows an insulating film and a conductive layer subsequently formed on a surface of a bottom of the cubic portion and the surface of the cubic portion of the storage node shown in FIG. 4 according to the present invention.

Following processes are used to form the insulating film and the second electrode of the capacitor. Refer to FIG. 6, the fourth dielectric layer 230 is formed on the exposed portion of the storage node 225, then a photolithography and an etching step is used to pattern the fourth dielectric layer 230. Next, a conductive layer 231 is formed on the third dielectric layer 224, Then a photolithography and an etching step is used to pattern the conductive layer 231. The patterned fourth dielectric layer 230 and the conductive layer 231 act as the insulating layer and the second electrode of the capacitor respectively. Because the effective area of the first electrode of the capacitor is increased, the capacitance is thus increased. The increase of the effective area of the first electrode is obtained by the interface-etching step according to the preferred embodiment of the present invention, so the capacitance is increased without additional process and cost.

Figure 7:
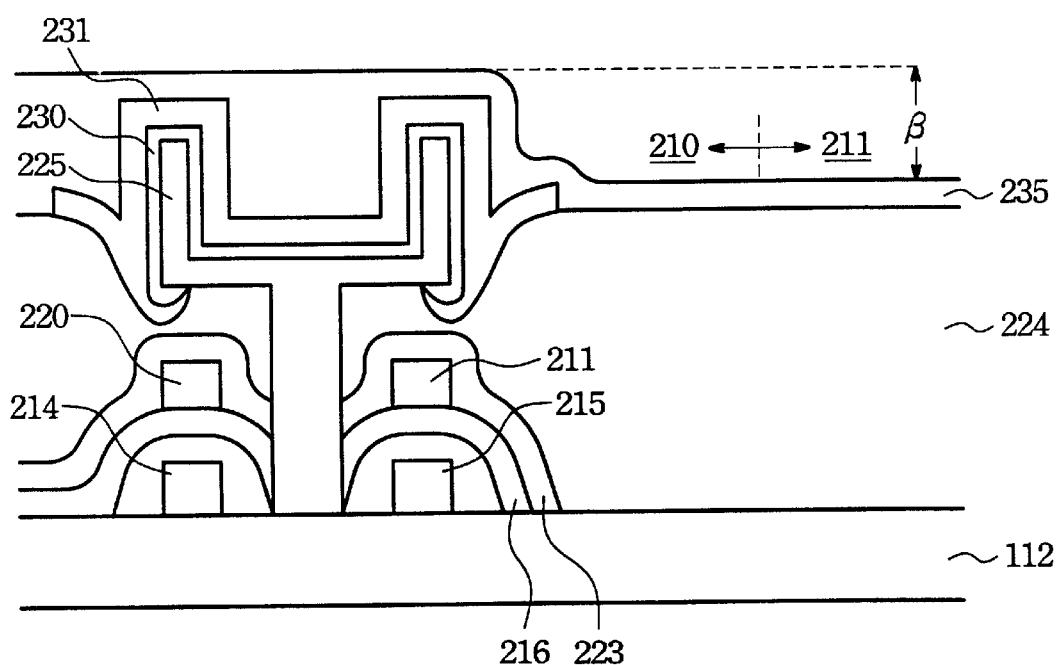
FIG. 7 shows the step height between the memory cell region and the periphery region of a memory device according to the present invention.

After the processes mentioned above, the capacitor is fabricated in the memory cell region 210. To isolate the electricity of the capacitor composed of the fourth dielectric layer 230, the conductive layer 231 and the underlying storage node 225, referring to FIG. 7, a fifth dielectric layer 235 is formed on the topography of the wafer including the memory cell region 210 and the periphery region 211. After the capacitor in the present invention is fabricated, proceed with the periphery region 211 to manufacture the periphery circuit in the periphery region 211. So the periphery circuit mentioned above, the bit lines and the gate electrode 215 of the transistor are formed as shown in FIG. 7. The periphery circuit mentioned above, the bit lines and the gate electrode 215 of the transistor are used to control the charge stored in the stacked capacitor. Due to the exposed portion of the stacked capacitor, as shown in FIG. 7, the altitude of the fifth dielectric layer 235 in the memory cell region 210 is higher than the altitude of the fifth dielectric layer 235 in the periphery region 211.

Figure 1:
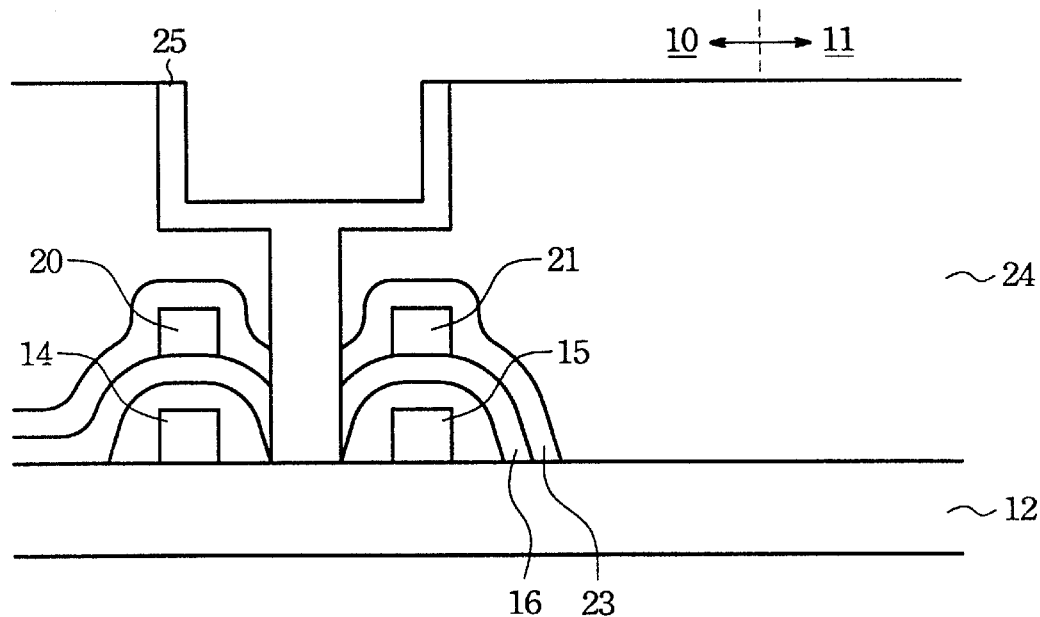
FIG. 1 is the cross sectional view of the wafer that a storage node is formed in the dielectric layer, in which the bit line and the transistor are formed.
Figure 2:
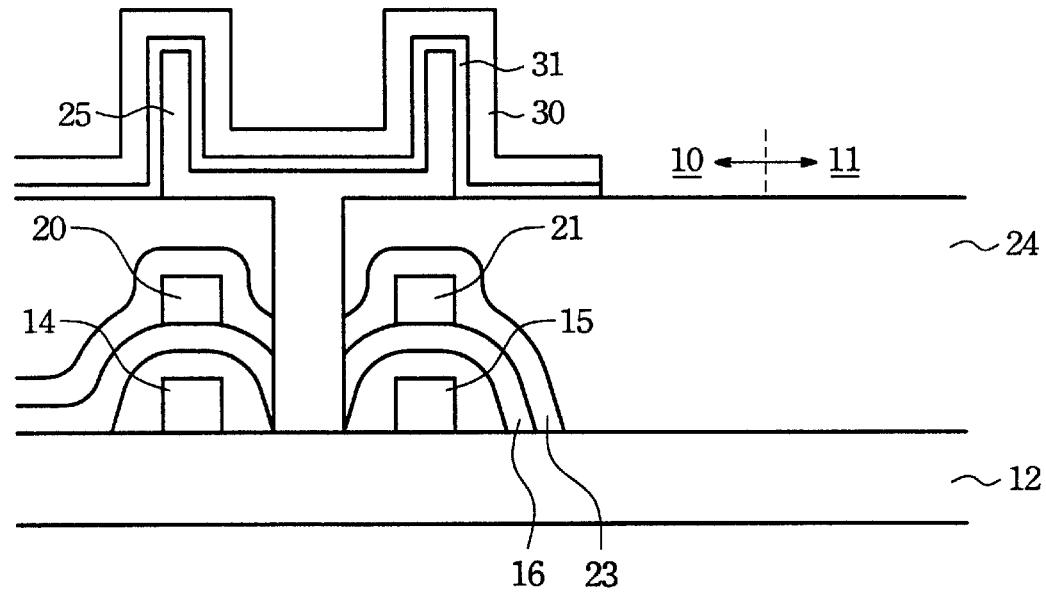
FIG. 2 shows an insulating film and a conductive layer subsequently formed on the surface of the cubic portion of the storage node shown in FIG. 1 according to the prior art.
Figure 3:
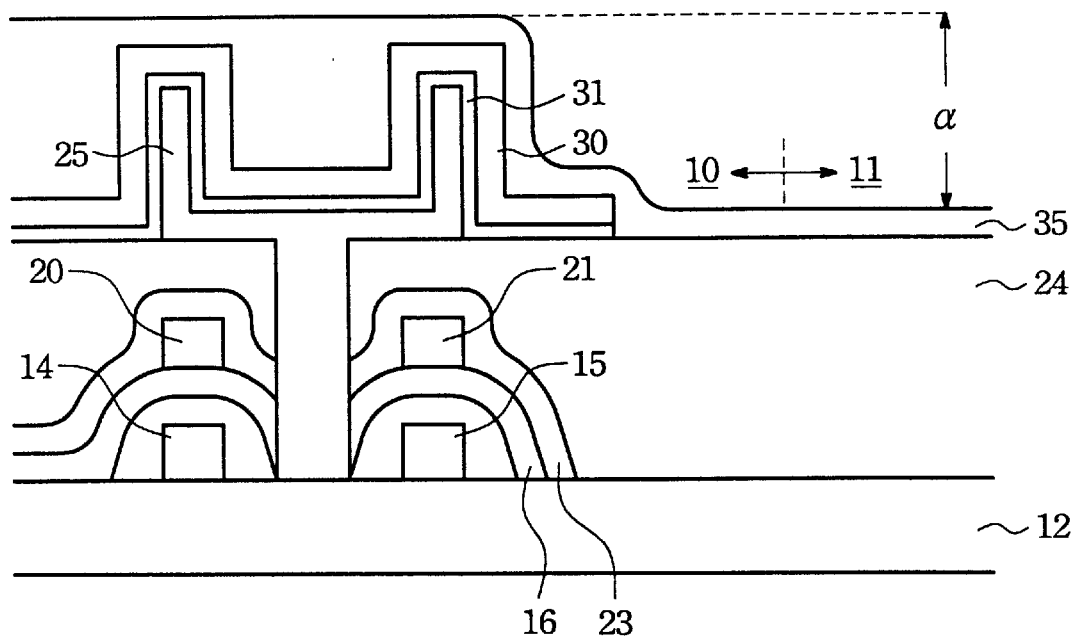
FIG. 3 shows the step height between the memory cell region and the periphery region of a memory device according to the prior art.

The step height β between the memory cell region 210 and the periphery region 211 of the capacitor of the memory device according to the present invention is reduced when compared with that of the prior art capacitor of the memory device. It is obvious that the altitude difference β between the memory cell region 210 and the periphery region 211 is smaller than the altitude difference α between the memory cell region 10 and the periphery region 11 of the prior art DRAM shown in FIG. 3. In addition, the capacitance of the capacitor according to the present invention is greater than that of the prior art capacitor.

As will be understood by persons skilled in the art, the foregoing preferred embodiment of the present invention is illustrative of the present invention rather than limiting the present invention. Having described the invention in connection with a preferred embodiment, for example, if various recipes are used in the preferred embodiment to etch the dielectric layer at the interface between the dielectric layer and a storage node made of poly-silicon. In addition, if various number of bit lines and transistors are contained in the memory cell. As long as the storage node is formed within one etching step that etches the dielectric layer at the interface of the dielectric layer and the storage node to form a semiconductor device having a reduced step height. The modification will now suggest itself to those skilled in the art. While the preferred embodiment of the invention has been illustrated and described, it will be appreciated that various changes can be made therein without departing from the spirit and scope of the invention.

What is claimed is:

1. A method for forming a capacitor on a substrate, said substrate having a first region and a second region, said capacitor being formed within said first region of said substrate, said method comprising:

forming a storage node within a dielectric layer on said substrate, wherein a bottom of a cubic portion of said storage node faces said substrate, said storage node being contact with said substrate;

etching a portion of said dielectric layer to expose a surface including said bottom of said cubic portion of said storage node, an altitude of said etched portion of said dielectric layer within said second region being higher than said altitude at said bottom of said cubic portion of said storage node facing said substrate;

forming an insulating layer on said exposed surface including said bottom of said cubic portion of said storage node; and forming a conductive layer on said insulating layer.

2. The method as claim 1, wherein said storage node is made of doped poly-silicon.

3. The method as claim 1, wherein said dielectric layer at an interface between said dielectric layer and said storage node is etched by a B.O.E (Buffered Oxide Etching).

4. The method as claim 1, wherein said dielectric layer is made of Borophosphosilicate glass (BPSG).

5. The method as claim 4, wherein said dielectric layer is formed by using source gas comprising boron ingredient about 5–7 percents in weight, and phosphorus ingredient about 2–4 percents in weight.

6. The method as claim 5, wherein said dielectric layer is formed by atmospheric chemical vapor deposition (APCVD).

7. A method for forming a capacitor on a substrate, said substrate having a first region and a second region, said capacitor being formed within said first region of said substrate, said method comprising:

forming a storage node within a dielectric layer on said substrate, wherein a bottom of a cubic portion of said storage node faces said substrate, said storage node being contact with said substrate, said dielectric layer made of Borophosphosilicate glass (BPSG) using boron ingredient about 5–7 percents in weight and phosphorus ingredient about 2–4 percents in weight as source gas in an atmospheric chemical vapor deposition (APCVD) process;

etching a portion of said dielectric layer to expose a surface including said bottom of said cubic portion of said storage node, an altitude of said etched portion of said dielectric layer within said second region being higher than said altitude at said bottom of said cubic portion of said storage node facing said substrate;

forming an insulating layer on said exposed surface including said bottom of said cubic portion of said storage node; and forming a conductive layer on said insulating layer.

8. The method as claim 7, wherein said storage node is made of doped poly-silicon.

9. The method as claim 7, wherein said dielectric layer at an interface between said dielectric layer and said storage node is etched by a B.O.E (Buffered Oxide Etching).

10. A method for forming a memory device, said method comprising:

forming a bit line on a first region of a substrate;

forming a transistor on said first region of said substrate, a portion of said first region of said substrate being between said bit line and said transistor;

forming a first dielectric layer on said bit line, said transistor, and said exposed portion of said first region of said substrate;

forming a second dielectric layer on said first dielectric layer and a second portion of said substrate;

etching said second dielectric layer to expose said portion of said first region of said substrate;

forming a storage node contacting with said portion of said first region of said substrate within said second dielectric layer, said storage node comprising a cubic portion connected to said portion of said first region of said substrate, wherein a bottom of said cubic portion of said storage node faces said substrate;

etching said second dielectric layer to expose a surface including said bottom of said cubic portion of said storage node;

forming an insulating layer on said exposed surface including said bottom of said cubic portion of said storage node;

forming a conductive layer on said insulating layer, wherein said storage node, said insulating layer, and said conductive layer constitutes a capacitor within said first region of said substrate, said capacitor being electrically coupled to said transistor;

forming periphery circuit within said second region of said substrate, said periphery circuit being used to control charges stored in said capacitor; and forming a third dielectric layer on said periphery circuit within said second region of said substrate, on said second dielectric layer within said second region of said substrate, and on said transistor within said first portion of said substrate.

11. The method as claim 10, wherein an altitude of said third dielectric layer within said second region of said substrate is higher than said altitude of said bottom of said cubic portion of said storage node facing said substrate, said altitude of said third dielectric layer within said second region of said substrate being lower than said altitude of said third dielectric layer within said first region of said substrate.

12. The method as claim 10, wherein said storage node is made of doped poly-silicon.

13. The method as claim 10, wherein said second dielectric layer at an interface between said second dielectric layer and said storage node is etched by a B.O.E (Buffered Oxide Etching).

14. The method as claim 10, wherein said second dielectric layer is made of Borophosphosilicate glass (BPSG).

15. The method as claim 14, wherein said second dielectric layer is formed by using source gas comprising boron ingredient about 5–7 percents in weight, and phosphorus ingredient about 2–4 percents in weight.

16. The method as claim 15, wherein said second dielectric layer is formed by atmospheric chemical vapor deposition (APCVD).

* * * * *